(12) United States Patent
Chen et al.

(10) Patent No.: US 9,968,009 B2
(45) Date of Patent: May 8, 2018

(54) SYSTEM WITH FRESH AIR FLOW TOWARD DOWNSTREAM COMPONENTS FOR COOLING

(71) Applicant: QUANTA COMPUTER INC., Taoyuan (TW)

(72) Inventors: Chao-Jung Chen, Taoyuan (TW); Yi-Chieh Chen, Taoyuan (TW); Jen-Mao Chen, Taoyuan (TW); Wei-Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days. days.

(21) Appl. No.: 15/414,311

(22) Filed: Jan. 24, 2017

(65) Prior Publication Data

US 2017/0325361 A1 Nov. 9, 2017

Related U.S. Application Data

(60) Provisional application No. 62/331,174, filed on May 3, 2016.

(51) Int. Cl.
| | |
|---|---|
| *H05K 7/20* | (2006.01) |
| *G06F 1/18* | (2006.01) |
| *G11B 33/12* | (2006.01) |
| *G11B 33/14* | (2006.01) |

(52) U.S. Cl.
CPC ......... *H05K 7/20736* (2013.01); *G06F 1/187* (2013.01); *G11B 33/128* (2013.01); *G11B 33/142* (2013.01); *H05K 7/20781* (2013.01); *H05K 7/20836* (2013.01)

(58) Field of Classification Search
CPC ........... H05K 7/20781; H05K 7/20836; H05K 7/20145; H05K 7/20563–7/20572; H05K 7/20727–7/20736; G06F 1/20
USPC ....... 361/695–697, 679.49–679.51; 454/184; 312/236
See application file for complete search history.

(56) References Cited

U.S. PATENT DOCUMENTS

| | | | | |
|---|---|---|---|---|
| 5,414,591 A | * | 5/1995 | Kimura ..................... | G06F 1/20 361/679.33 |
| 5,477,416 A | * | 12/1995 | Schkrohowsky .. | H05K 7/20563 361/695 |
| 5,493,474 A | * | 2/1996 | Schkrohowsky .... | G11B 33/142 361/695 |

(Continued)

*Primary Examiner* — David M Sinclair
*Assistant Examiner* — Robert Brown
(74) *Attorney, Agent, or Firm* — Nixon Peabody LLP; Eduardo J. Quinones; Zhou Lu

(57) ABSTRACT

The present technology provides a system for supplying fresh air to downstream components. The system comprises a housing with a first end and a second end, a first plurality of partitions disposed in the housing, and a second plurality of partitions disposed in the housing. The housing comprises a base portion and first and second opposing sidewalls extending from the first end to the second end. Each of the first plurality of partitions includes at least one first ventilation opening associated with each of the plurality of compartments. Each one of the second plurality of partitions comprises at least one partition duct extending through the plurality of partition rows and at least one second ventilation opening connecting the at least one partition duct to associated ones of the plurality of compartments.

20 Claims, 10 Drawing Sheets

(56) References Cited

U.S. PATENT DOCUMENTS

| | | | | |
|---|---|---|---|---|
| 7,715,188 | B2* | 5/2010 | Matsushima | G11B 33/142 |
| | | | | 165/122 |
| 7,813,120 | B2* | 10/2010 | Vinson | H05K 7/20736 |
| | | | | 312/236 |
| 8,743,549 | B2* | 6/2014 | Frink | G06F 1/187 |
| | | | | 361/724 |
| 2002/0131257 | A1* | 9/2002 | Agard | H05K 7/1425 |
| | | | | 361/796 |
| 2009/0213543 | A1* | 8/2009 | Nemoz | H05K 7/20563 |
| | | | | 361/694 |
| 2013/0270984 | A1* | 10/2013 | Chuda | H05K 7/20572 |
| | | | | 312/236 |
| 2013/0329364 | A1* | 12/2013 | Kameno | H05K 7/20563 |
| | | | | 361/697 |
| 2013/0342996 | A1* | 12/2013 | Fricker | H05K 7/1441 |
| | | | | 361/695 |
| 2014/0085804 | A1* | 3/2014 | Song | G06F 1/183 |
| | | | | 361/679.33 |
| 2014/0150999 | A1* | 6/2014 | Wei | H05K 7/1497 |
| | | | | 165/121 |
| 2015/0070829 | A1* | 3/2015 | Ning | H05K 7/20727 |
| | | | | 361/679.33 |
| 2016/0128223 | A1* | 5/2016 | Fu | H05K 7/1489 |
| | | | | 361/679.31 |

* cited by examiner

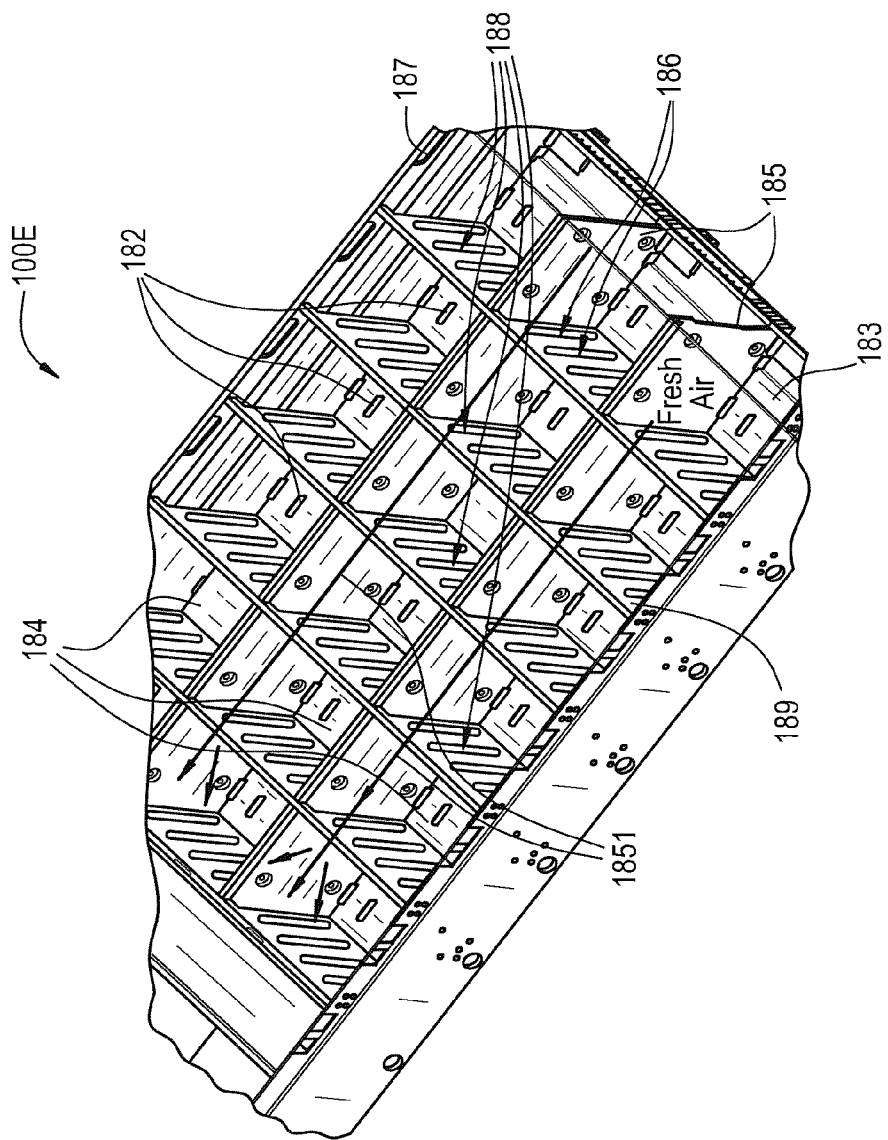

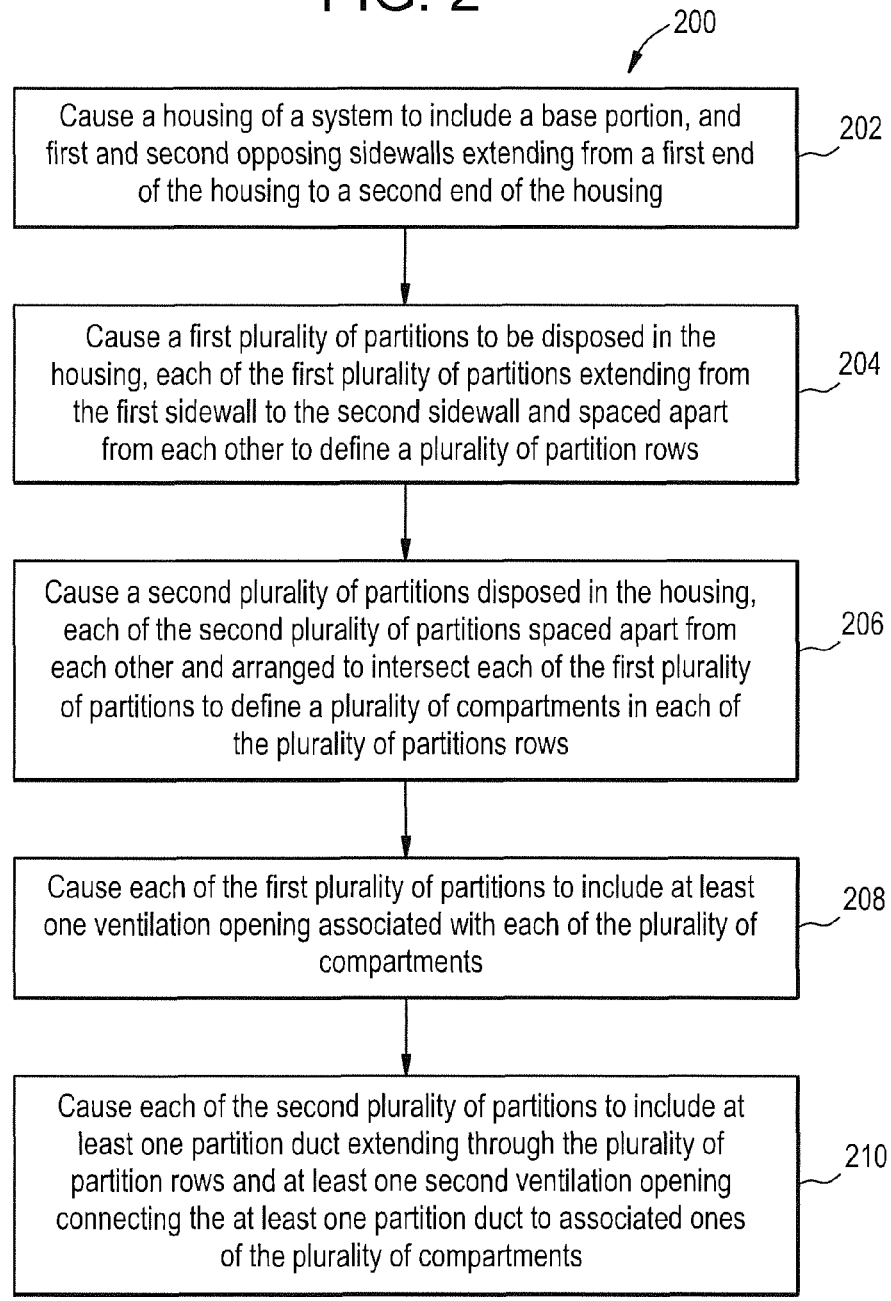

SYSTEM WITH FRESH AIR FLOW TOWARD DOWNSTREAM COMPONENTS FOR COOLING

CROSS-REFERENCE TO RELATED APPLICATIONS

The present application claims priority to and the benefit of U.S. Provisional Patent Application No. 62/331,174, filed May 3, 2016, the contents of which are herein incorporated by reference in their entirety as if fully set forth herein.

TECHNICAL FIELD

The present technology relates generally to cooling in a server system.

BACKGROUND

Network traffic associated with messaging, video/image and e-mail has grown explosively in recent years. To support the network traffic, demands for cloud-based storage of network systems have exponentially increased. One solution to meet storage demands is to add more hard disk drives (HDDs) and thus increases HDD density within the systems. However, it has been a challenge to cool down a system with high density HDDs. In order to cool down a system with higher density HDDs, additional cooling fans are typically needed in the system. However, additional cooling fans increase power consumption of a system. For a datacenter with a large number of server and/or storage systems, additional cooling fans can result in a substantial increase in costs, in terms of components and power. Further, vibrations caused by additional cooling fans may also reduce HDD performance in a system.

SUMMARY

Systems and methods in accordance with various examples of the present technology provide a solution to the above-mentioned problems by supplying fresh air to downstream components of a system. The system comprises a housing with a first end and a second end, a first plurality of partitions disposed in the housing, and a second plurality of partitions disposed in the housing. The housing comprises a base portion and first and second opposing sidewalls extending from the first end to the second end. Each of the first plurality of partitions extends from the first sidewall to the second sidewall and is spaced apart from each other to define a plurality of partition rows. Each of the second plurality of partitions is spaced apart from each other and arranged to intersect each of the first plurality of partitions to define a plurality of compartments in each of the plurality of partition rows. Each of the first plurality of partitions includes at least one first ventilation opening associated with each of the plurality of compartments. Each one of the second plurality of partitions comprises at least one partition duct extending through the plurality of partition rows and at least one second ventilation opening connecting the at least one partition duct to associated ones of the plurality of compartments. The at least one second ventilation opening disposed on each of the second plurality of partitions towards the second end.

In some examples, the system comprises at least one first sidewall duct disposed in the housing along one of the first sidewall or the second sidewall. The at least one first sidewall duct connects a portion of the housing towards the first end beyond the plurality of rows to an interior one of the plurality of rows. In some examples, the system further comprises at least one second sidewall duct disposed in the housing along one of the first sidewall or the second sidewall. The at least one second sidewall duct connects a portion of the housing towards the second end beyond the plurality of rows to an interior one of the plurality of rows.

In some examples, each of the at least one first sidewall duct and the at least one second sidewall duct comprises at least one third ventilation opening connecting the corresponding sidewall duct to associated ones of the plurality of compartments. The at least one third ventilation opening faces the second end.

In some examples, the base portion of the system comprises a circuit board configured to support a plurality of storage devices. The circuit board comprises at least one type of interface that includes a Serial Attached SCSI (SAS) interface, a serial ATA (SATA) interface, or a Peripheral Component Interconnect Express (PCIe) interface. The SAS interface or the SATA interface is configured to support a HDD. The PCIe interface is configured to support a solid state drive (SSD). The system further includes a plurality of storage devices comprising at least a SAS HDD, SATA HDD, or SSD.

In some examples, at least one of the plurality of second ventilation openings is configured to be open or close. Each of the plurality of compartments comprises a temperature sensor. In response to determining that a measured temperature of one of the plurality of compartments is above a threshold temperature, the system can open corresponding second ventilation openings of the at least one partition duct to cool down components located in the corresponding compartment.

In some examples, at least one of the plurality of third ventilation openings is configured to be open or close. In response to determining that a measured temperature of one of the plurality of compartments is above a threshold temperature, the system can open corresponding third ventilation openings of the at least one first sidewall duct or the at least one second sidewall duct to cool down components located in the corresponding compartment.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only example aspects of the disclosure and are not therefore to be considered to be limiting of its scope, the principles herein are described and explained with additional specificity and detail through the use of the accompanying drawings in which:

FIGS. 1B-G illustrate schematic block diagrams of an exemplary system providing fresh air to downstream components of the exemplary system in accordance with an implementation of the present technology;

FIG. 2 illustrates an exemplary method for providing fresh air to downstream components of a system in accordance with an implementation of the present technology;

DETAILED DESCRIPTION

Various examples of the present technology provide systems and methods for supplying fresh air to downstream components of a system. The system comprises a housing with a first end and a second end, a first plurality of partitions disposed in the housing, and a second plurality of partitions disposed in the housing. The housing comprises a base portion and first and second opposing sidewalls extending from the first end to the second end. Each of the first plurality of partitions includes at least one first ventilation opening associated with each of the plurality of compartments. Each one of the second plurality of partitions comprises at least one partition duct extending through the plurality of partition rows and at least one second ventilation opening connecting the at least one partition duct to associated ones of the plurality of compartments. The at least one second ventilation opening faces the second end.

Figure 1A:
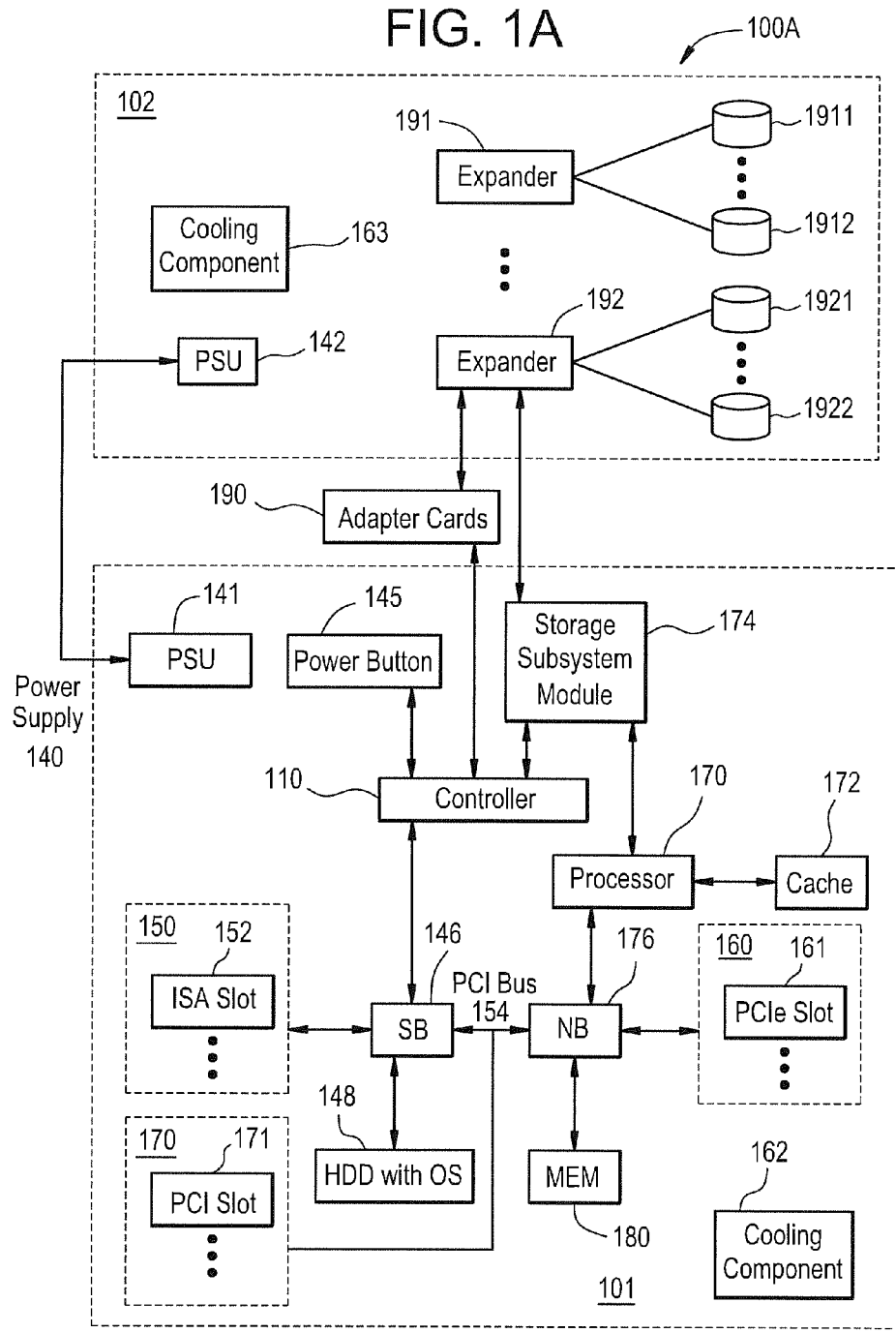
FIG. 1A illustrates a schematic block diagram of an exemplary system containing a storage subsystem and a server system in accordance with an implementation of the present technology.

FIG. 1A illustrates a schematic block diagram of an exemplary system 100A containing a storage subsystem 102 and a server system 101 in accordance with an implementation of the present technology. In this example, the server system 101 comprises at least one microprocessor or processor 170 connected to a cache 172, one or more cooling components 162, a main memory (MEM) 180, at least one power supply unit (PSU) 141 that receives an AC power from a power supply 140 and provides power to the server system 101. The storage subsystem 102 comprises one or more PSUs 142 that receive an AC power from the power supply 140 and provides power to the storage subsystem 102, at least one expander (e.g., expanders 191 and 192), one or more cooling components 163, and a plurality of storage devices (e.g., 1911, 1912, 1921 and 1922). The storage devices may include at least one of SCSI (SAS) disk, a serial ATA (SATA) disk, or a solid state drive (SSD). The storage devices may be individual storage devices or may be arranged in a RAID (Redundant Array of Independent Disks). Each of the at least one expander is configured to manage one or more storage devices of the storage subsystem 102 (e.g., receiving commands and routing them to the corresponding storage devices) and communicate with a remote device over a network, a management module, and other expanders of the storage subsystem 102. The commands may include read or write commands, information requests, or management commands (e.g., zoning commands). The command can be in a format of text, small computer system interface (SCSI), AT attachment (ATA), or serial ATA (SATA). In this example, the expander 191 is configured to manage the storage devices 1911 and 1912, while the expander 192 is configured to manage the storage devices 1921 and 1922.

In this example, the at least one expander (e.g., expanders 191 and 192) can also provide a command-line interface (CLI) between one or more adapter cards 190 and the storage subsystem 102. The one or more adapter cards 190 or remote user can input commands via the CLI. The CLI includes, but is not limited to, digital command language (DCL), various Unix shells, control program for microcomputers (CP/M), command.com, cmd.exe, and resource time sharing system (RSTS) CLI.

In some implementations, the expanders of the storage subsystem 102 are connected to the plurality of storage devices in the storage subsystem 102 with connection redundancy to protect against a failed communication link (e.g., a failed cable or port, or accidentally unplugged connection). In some implementations, the storage subsystem 102 and the server system 101 can be configured on a single rack or different server racks.

The at least one PSU 141 is configured to supply power to various components of the server system 101, such as the processor 170, cache 172, NB logic 176, PCIe slots 160, Memory 180, SB logic 146, storage device 148, ISA slots 150, PCI slots 170, controller 110, and one or more cooling components 162. After being powered on, the server system 101 is configured to load software application from memory, computer storage device, or an external storage device to perform various operations. The hard drive 148 is structured into logical blocks that are available to an operating system and applications of the server system 101 and configured to retain server data even when the server system 101 is powered off.

In some examples, the one or more cooling components 162 can be an air-cooled component, a liquid-cooled component, or a combination of air- and liquid-cooled components. In some examples, the one or more cooling components 162 comprise a plurality of fans located at the front side and/or backside of the server system 101.

The main memory 180 can be coupled to the processor 170 via a north bridge (NB) logic 176. A memory control module (not shown) can be used to control operations of the memory 180 by asserting necessary control signals during memory operations. The main memory 180 may include, but is not limited to, dynamic random access memory (DRAM), double data rate DRAM (DDR DRAM), static RAM (SRAM), or other types of suitable memory.

In some implementations, the processor 170 can be multi-core processors, each of which is coupled together through a CPU bus connected to the NB logic 176. In some implementations, the NB logic 176 can be integrated into the processor 170. The NB logic 176 can also be connected to a plurality of peripheral component interconnect express (PCIe) slots 160 and a south bridge (SB) logic 146. The plurality of PCIe slots 160 can be used for connections and buses such as PCI Express x1, USB 2.0, SMBus, SIM card, future extension for another PCIe lane, 1.5 V and 3.3 V power, and wires to diagnostics LEDs on the server's chassis.

In this example, the NB logic 176 and the SB logic 146 are connected by a peripheral component interconnect (PCI) Bus 154. The PCI Bus 154 can support function on the CPU 110 but in a standardized format that is independent of any of CPU's native buses. The PCI Bus 154 can be further connected to a plurality of PCI slots 170 (e.g., a PCI slot 171). Devices connect to the PCI Bus 154 may appear to a bus controller (not shown) to be connected directly to a CPU bus, assigned addresses in the processor 170's address space, and synchronized to a single bus clock. PCI cards can be used in the plurality of PCI slots 170 include, but are not limited to, network interface cards (NICs), sound cards, modems, TV tuner cards, disk controllers, video cards, small computer system interface (SCSI) adapters, and personal computer memory card international association (PCMCIA) cards.

The SB logic 146 can couple the PCI bus 154 to a plurality of expansion cards or slots 150 (e.g., an ISA slot 152) via an expansion bus. The expansion bus can be a bus used for communications between the SB logic 146 and peripheral devices, and may include, but is not limited to, an industry standard architecture (ISA) bus, PC/104 bus, low pin count bus, extended ISA (EISA) bus, universal serial bus (USB), integrated drive electronics (IDE) bus, or any other suitable bus that can be used for data communications for peripheral devices.

In the example, the SB logic 146 is further coupled to a controller 110 that is connected to the at least one PSU 141. In some implementations, the controller 110 can be a baseboard management controller (BMC), rack management controller (RMC), or any other suitable type of system controller. The controller 110 is configured to control operations of the at least one PSU 141 and/or other applicable operations. In some implementations, the controller 110 is configured to monitor processing demands, and components and/or connection status of the server system 101.

In this example, the controller 110 is connected to the at least one expander (e.g., expanders 191 and 192) of the storage subsystem 102 via a cable or wireless connection (e.g., I2C, SMBus, or PCIe). In some examples, the controller 110 can be coupled to one or more cooling components 163 of the storage subsystem 102 and manage operations of the one or more cooling components 163. In some examples, the storage subsystem 102 can comprise a separate controller (not shown) to manage the operations of the one or more cooling components 163.

Figure 1B:
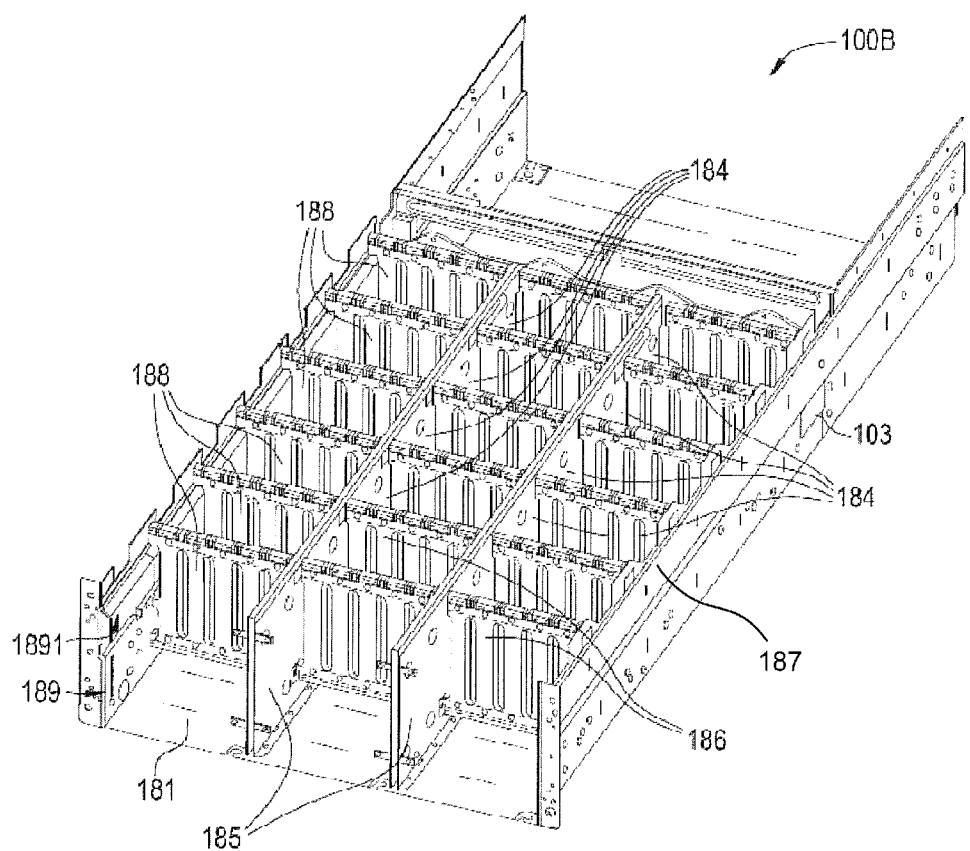
Figure 1C:
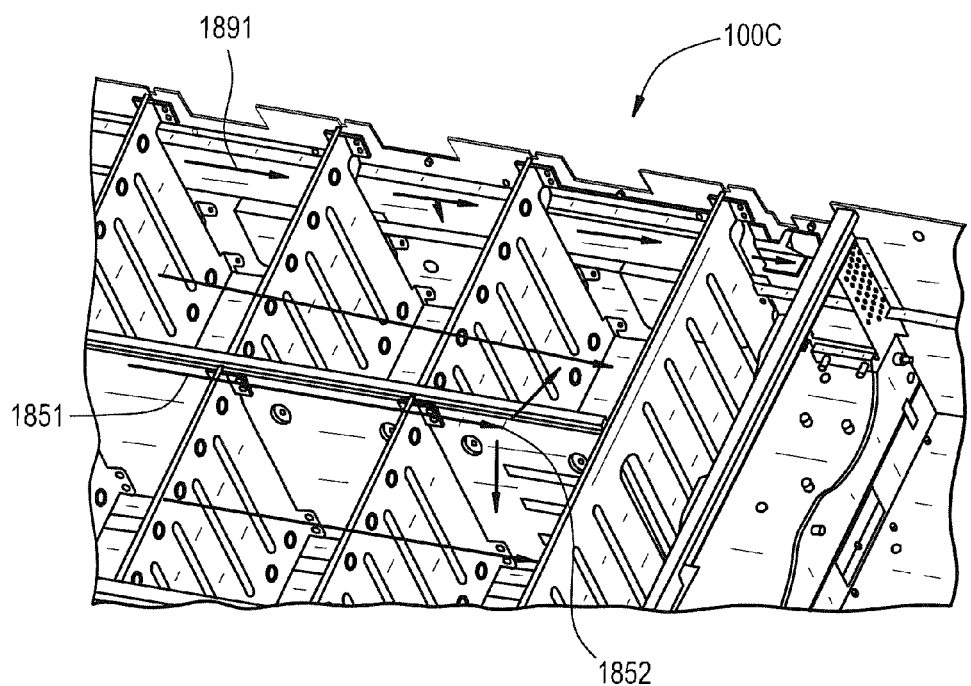
Figure 1D:
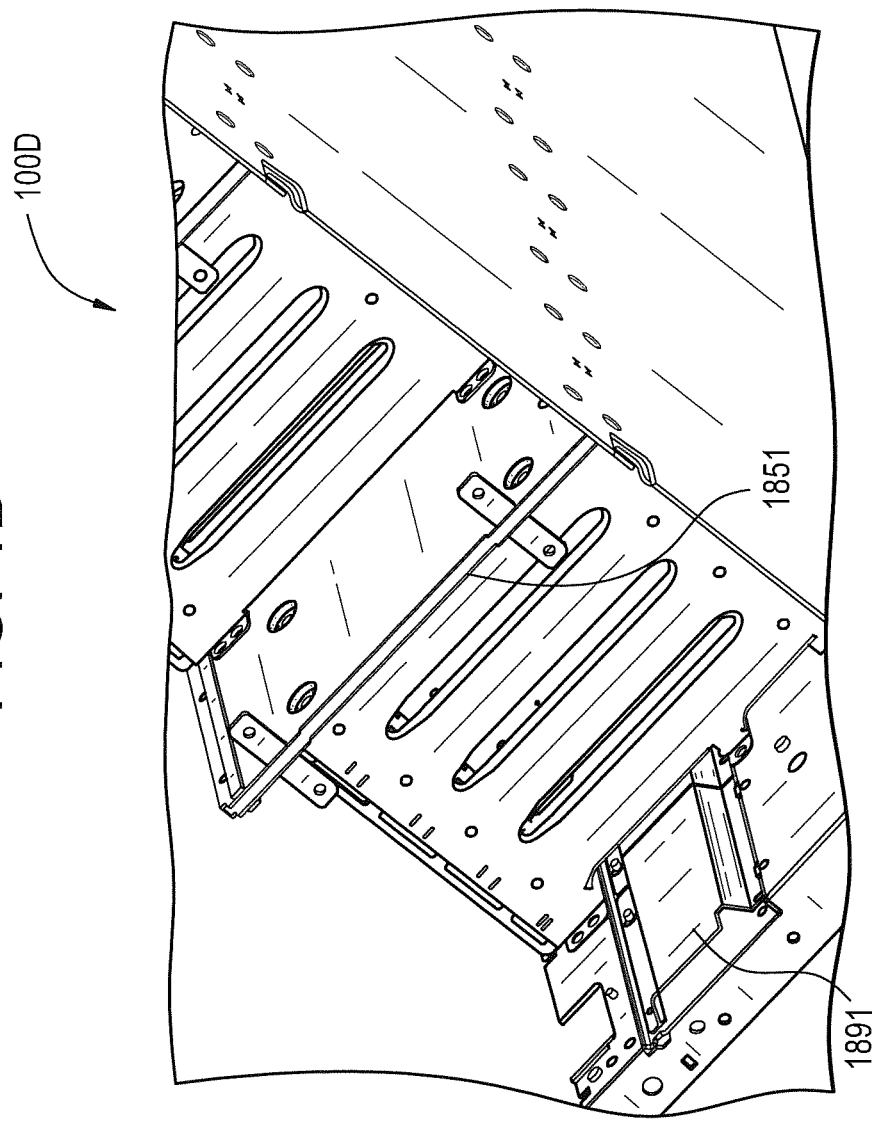

FIG. 1B illustrates an exemplary block diagram of an exemplary system 100B providing fresh air to downstream components of the exemplary system 100B in accordance with an implementation of the present technology. In this example, the system 100B comprises a housing 103 with a front end and a back end, a first plurality of partitions 188 disposed in the housing 103 and a second plurality of partitions 185 disposed in the housing 103. The housing 103 comprises a base portion 181, first and second opposing sidewalls 187 and 189 extending from the front end to the back end. Each of the first plurality of partitions 188 extends from the first sidewall 189 to the second sidewall 187 and is spaced apart from each other to define a plurality of partition rows. Each of the second plurality of partitions 185 is spaced apart from each other and arranged to intersect each of the first plurality of partitions 188 to define a plurality of compartments 184 in each of the plurality of partition rows. Each of the first plurality of partitions 188 includes at least one first ventilation opening 186 associated with each of the plurality of compartments 184. At least one of the second plurality of partitions 185 comprises at least one partition duct 1851, as illustrated in FIG. 1C, extending through the plurality of partition rows and at least one second ventilation opening 1852, as illustrated in FIGS. 1C and 1D, connecting the at least one partition duct 1851 to associated ones of the plurality of compartments 184. In some examples, the at least one second ventilation opening 1852 faces the back end of the housing 103.

Figure 1F:
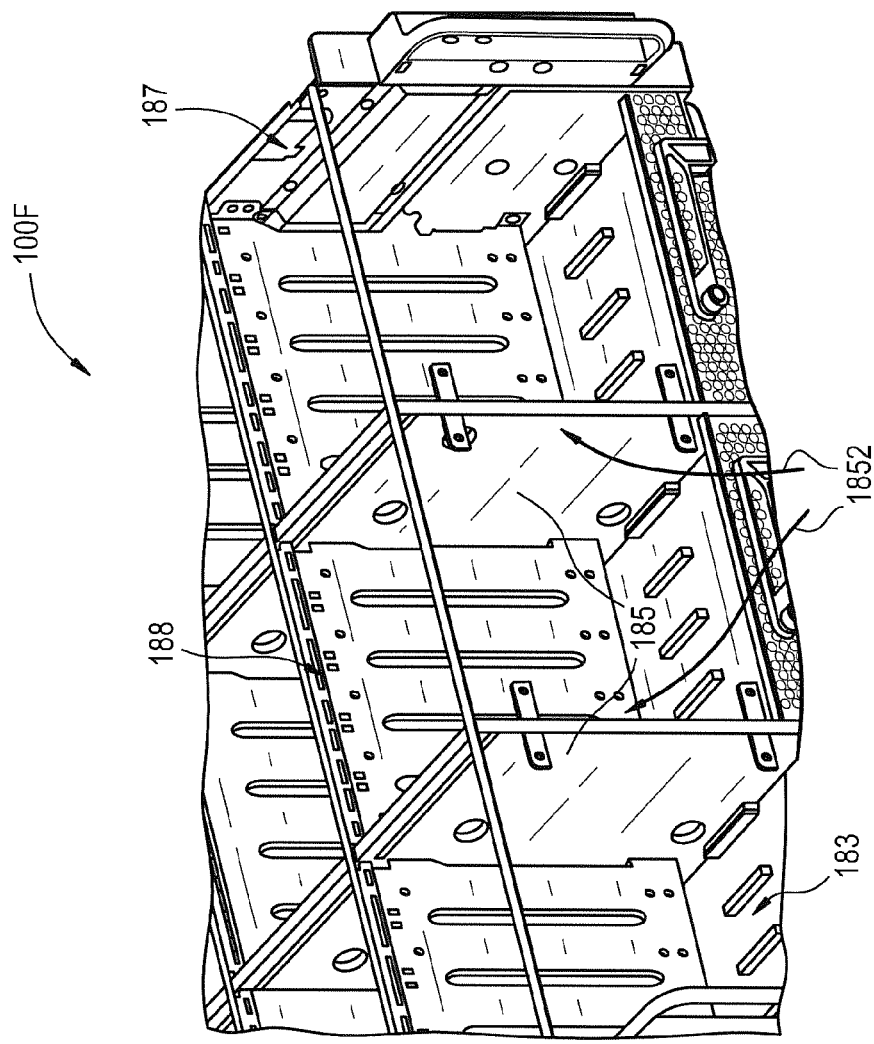
Figure 1G:
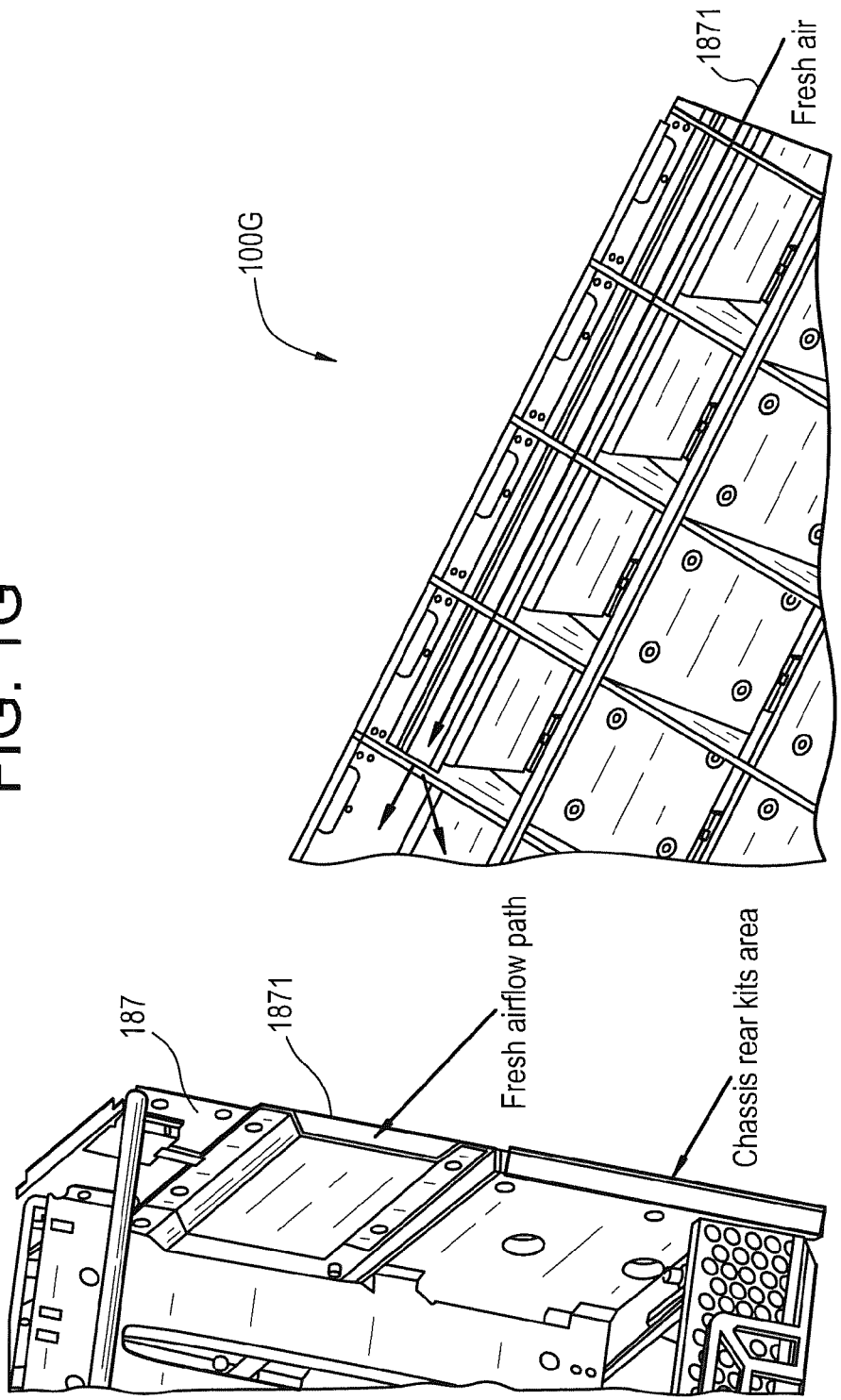

In some examples, the system 100B comprises at least one first sidewall duct (e.g., 1891) disposed in the housing 103 along the first sidewall 189. The at least one first sidewall duct 1891 connects a portion of the housing 103 towards the front end beyond the plurality of rows to an interior one of the plurality of rows. In some examples, the system further comprises at least one second sidewall duct 1871, as illustrated in FIG. 1G, disposed in the housing 103 along the second sidewall 187. The at least one second sidewall duct 1871 connects a portion of the housing 103 towards the back end beyond the plurality of rows to an interior one of the plurality of rows.

In some examples, at least one of the plurality of second ventilation openings 1852 is configured to be open or close. Each of the plurality of compartments 184 comprises a temperature sensor (not shown). In response to determining that a measured temperature of one of the plurality of compartments 184 is above a threshold temperature, the system 100B can open corresponding second ventilation openings 1852 of the at least one partition duct 1851 to cool down components located in the corresponding compartment 184.

FIG. 1E illustrates an exemplary block diagram of an exemplary system 100E providing fresh air to downstream components of the exemplary system 100E in accordance with an implementation of the present technology. In this example, the base portion 181 the system 100E includes a circuit board 183 comprising a plurality of interfaces 182. The plurality of interfaces 182 are configured to support at least a plurality of storage devices (not shown). Each of the second plurality of partitions 185 extends from the front end of the housing 103 towards the rear end of the housing 103. At least one of the second plurality of partitions 185 comprises at least one partition duct 1851 extending through the plurality of partition rows and at least one second ventilation opening 1852, as illustrated in FIG. 1F, connecting the at least one partition duct 1851 to associated ones of the plurality of compartments 184.

In some examples, the plurality of interfaces 182 comprises at least one type of interface that includes a SAS interface, a SATA interface, or a PCIe interface. The SAS interface or the SATA interface is configured to support a HDD. The PCIe interface is configured to support a SSD. The system 100E further includes a plurality of storage devices comprising at least a SAS HDD, SATA HDD, or SSD.

In some examples, at least one of the plurality of second ventilation openings 1852 is configured to be open or close. Each of the plurality of compartments 184 comprises a temperature sensor. In response to determining that a measured temperature of one of the plurality of compartments 184 is above a threshold temperature, the system 100E can open corresponding second ventilation openings 1852 of the at least one partition duct 1851 to cool down components located in the corresponding compartment 184.

Although only certain components are shown within the exemplary systems 100A-100G in FIGS. 1A-1G, respectively, various types of electronic or computing components that are capable of processing or storing data, receiving or transmitting signals, or providing fresh air to downstream components can also be included in the exemplary systems 100A-100G. Further, the electronic or computing components in the exemplary systems 100A-100G can be configured to execute various types of application and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for the exemplary systems 100A-100G, a variety of networking and messaging protocols can be used, including but not limited to TCP/IP, open systems interconnection (OSI), file transfer protocol (FTP), universal plug and play (UpnP), network file system (NFS), common internet file system (CIFS), AppleTalk etc. As would be appreciated by those skilled in the art, the exemplary systems 100A-100G illustrated in FIGS. 1A-1G are used for purposes of explanation. Therefore, a network system can be implemented with many variations, as appropriate, yet still provide a configuration of network platform in accordance with various examples of the present technology.

In exemplary configurations of FIGS. 1A-1G, the exemplary systems 100A-100G can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art. Various other elements and/or combinations are possible as well within the scope of various examples.

The above discussion is meant to be illustrative of the principles and various examples of the present technology. Numerous variations and modifications will become apparent once the above disclosure is fully appreciated.

FIG. 2 illustrates an exemplary method 200 for providing fresh air to downstream components in accordance with an implementation of the present technology. It should be understood that the exemplary method 200 is presented solely for illustrative purposes and that in other methods in accordance with the present technology can include additional, fewer, or alternative steps performed in similar or alternative orders, or in parallel. The exemplary method 200 starts with configuring a housing of a system to include a base portion, and a first and second opposing sidewalls extending from a first end of the housing to a second end of the housing (e.g., as illustrated in FIGS. 1B-1G), at step 202. In some examples, the base portion can comprise a circuit board that comprises a plurality of interfaces. The plurality of interfaces is configured to support at least a SAS HDD, SATA HDD, or SSD.

At step 204, a first plurality of partitions can be disposed in the housing. Each of the first plurality of partitions extends from the first sidewall to the second sidewall and can be spaced apart from each other to define a plurality of partition rows. Some examples of the housing are illustrated in FIGS. 1B-1G.

At step 206, a second plurality of partitions can be disposed in the housing. Each of the second plurality of partitions is spaced apart from each other and is arranged to intersect each of the first plurality of partitions to define a plurality of compartments in each of the plurality of rows, which are illustrated in FIGS. 1B-1G.

At step 208, the system causes each of the first plurality of partitions to include at least one ventilation opening associated with each of the plurality of compartments, as illustrated in FIGS. 1B-1G.

At step 210, the system causes each of the second plurality of partitions to include at least one partition duct extending through the plurality of partition rows and at least one second ventilation opening connecting the at least one partition duct to associated ones of the plurality of compartments, as illustrated in FIGS. 1B-1G.

Terminologies

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks can be further interconnected by an intermediate network node, such as a router, to extend the effective "size" of each network.

Overlay networks generally allow virtual networks to be created and layered over a physical network infrastructure. Overlay network protocols, such as Virtual Extensible LAN (VXLAN), Network Virtualization using Generic Routing Encapsulation (NVGRE), Network Virtualization Overlays (NVO3), and Stateless Transport Tunneling (STT), provide a traffic encapsulation scheme which allows network traffic to be carried across L2 and L3 networks over a logical tunnel. Such logical tunnels can be originated and terminated through virtual tunnel end points (VTEPs).

Moreover, overlay networks can include virtual segments, such as VXLAN segments in a VXLAN overlay network, which can include virtual L2 and/or L3 overlay networks over which VMs communicate. The virtual segments can be identified through a virtual network identifier (VNI), such as a VXLAN network identifier, which can specifically identify an associated virtual segment or domain.

Network virtualization allows hardware and software resources to be combined in a virtual network. For example, network virtualization can allow multiple numbers of VMs to be attached to the physical network via respective virtual LANs (VLANs). The VMs can be grouped according to their respective VLAN, and can communicate with other VMs as well as other devices on the internal or external network.

Network segments, such as physical or virtual segments, networks, devices, ports, physical or logical links, and/or traffic in general can be grouped into a bridge or flood domain. A bridge domain or flood domain can represent a broadcast domain, such as an L2 broadcast domain. A bridge domain or flood domain can include a single subnet, but can also include multiple subnets. Moreover, a bridge domain can be associated with a bridge domain interface on a network device, such as a switch. A bridge domain interface can be a logical interface which supports traffic between an L2 bridged network and an L3 routed network. In addition, a bridge domain interface can support internet protocol (IP) termination, VPN termination, address resolution handling, MAC addressing, etc. Both bridge domains and bridge domain interfaces can be identified by a same index or identifier.

Furthermore, endpoint groups (EPGs) can be used in a network for mapping applications to the network. In particular, EPGs can use a grouping of application endpoints in a network to apply connectivity and policy to the group of applications. EPGs can act as a container for buckets or collections of applications, or application components, and tiers for implementing forwarding and policy logic. EPGs also allow separation of network policy, security, and forwarding from addressing by instead using logical application boundaries.

Cloud computing can also be provided in one or more networks to provide computing services using shared resources. Cloud computing can generally include Internet-based computing in which computing resources are dynamically provisioned and allocated to client or user computers or other devices on-demand, from a collection of resources available via the network (e.g., "the cloud"). Cloud computing resources, for example, can include any type of resource, such as computing, storage, and network devices, virtual machines (VMs), etc. For instance, resources can include service devices (firewalls, deep packet inspectors, traffic monitors, load balancers, etc.), compute/processing devices (servers, CPU's, memory, brute force processing capability), storage devices (e.g., network attached storages, storage area network devices), etc. In addition, such resources can be used to support virtual networks, virtual machines (VM), databases, applications (Apps), etc.

Cloud computing resources can include a "private cloud," a "public cloud," and/or a "hybrid cloud." A "hybrid cloud" can be a cloud infrastructure composed of two or more clouds that inter-operate or federate through technology. In essence, a hybrid cloud is an interaction between private and public clouds where a private cloud joins a public cloud and utilizes public cloud resources in a secure and scalable manner. Cloud computing resources can also be provisioned via virtual networks in an overlay network, such as a VXLAN.

Figure 3:
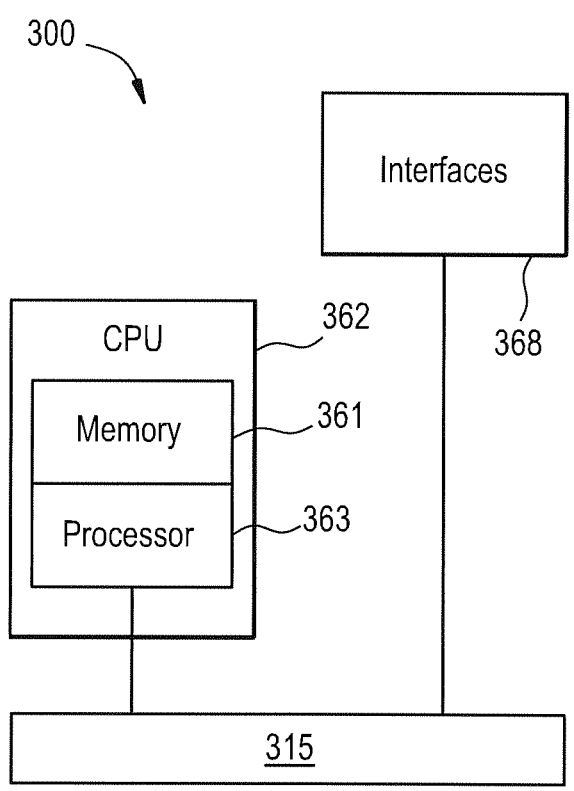
FIG. 3 illustrates an exemplary computing device in accordance with various implementations of the technology.
Figure 4:
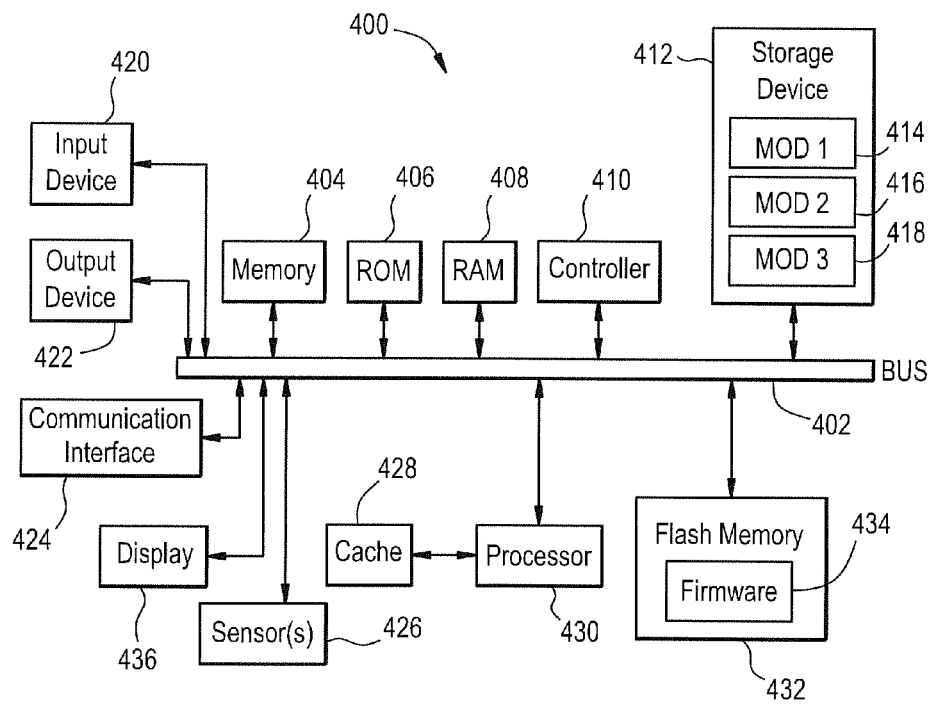
FIGS. 4 and 5 illustrate exemplary systems in accordance with various examples of the present technology.

In a network switch system, a lookup database can be maintained to keep track of routes between a number of end points attached to the switch system. However, end points can have various configurations and are associated with numerous tenants. These end-points can have various types of identifiers, e.g., IPv4, IPv6, or Layer-2. The lookup database has to be configured in different modes to handle different types of end-point identifiers. Some capacity of the lookup database is carved out to deal with different address types of incoming packets. Further, the lookup database on the network switch system is typically limited by 1K virtual routing and forwarding (VRFs). Therefore, an improved lookup algorithm is desired to handle various types of end-point identifiers. The disclosed technology addresses the need in the art for address lookups in a telecommunications network. Disclosed are systems, methods, and computer-readable storage media for unifying various types of end-point identifiers by mapping end-point identifiers to a uniform space and allowing different forms of lookups to be uniformly handled. A brief introductory description of example systems and networks, as illustrated in FIGS. 3 and 4, is disclosed herein. These variations shall be described herein as the various examples are set forth. The technology now turns to FIG. 3.

FIG. 3 illustrates an example computing device 300 suitable for implementing the present technology. Computing device 300 includes a master central processing unit (CPU) 362, interfaces 368, and a bus 315 (e.g., a PCI bus). When acting under the control of appropriate software or firmware, the CPU 362 is responsible for executing packet management, error detection, and/or routing functions, such as miscabling detection functions, for example. The CPU 362 preferably accomplishes all these functions under the control of software including an operating system and any appropriate applications software. CPU 362 can include one or more processors 363 such as a processor from the Motorola family of microprocessors or the MIPS family of microprocessors. In an alternative example, processor 363 is specially designed hardware for controlling the operations of the computing device 300. In a specific example, a memory 361 (such as non-volatile RAM and/or ROM) also forms part of CPU 362. However, there are many different ways in which memory could be coupled to the system.

The interfaces 368 are typically provided as interface cards (sometimes referred to as "line cards"). Generally, they control the sending and receiving of data packets over the network and sometimes support other peripherals used with the computing device 300. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 362 to efficiently perform routing computations, network diagnostics, security functions, etc.

Although the system shown in FIG. 3 is one specific computing device of the present technology, it is by no means the only network device architecture on which the present patent application can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 361) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 5:
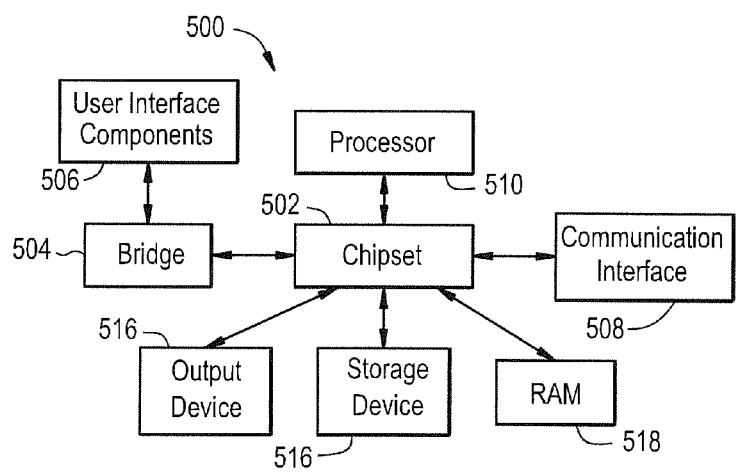

FIGS. 4 and 5 illustrate example system embodiments. The more appropriate embodiment will be apparent to those of ordinary skill in the art when practicing the present technology. Persons of ordinary skill in the art will also readily appreciate that other system embodiments are possible.

FIG. 4 illustrates a system bus computing system architecture 400 wherein the components of the system are in electrical communication with each other using a bus 402. Example system 400 includes a processing unit (CPU or processor) 430 and a system bus 402 that couples various system components including the system memory 404, such as read only memory (ROM) 406 and random access memory (RAM) 408, to the processor 430. The system 400 can include a cache of high-speed memory connected directly with, in close proximity to, or integrated as part of the processor 430. The system 400 can copy data from the memory 404 and/or the storage device 412 to the cache 428 for quick access by the processor 430. In this way, the cache can provide a performance boost that avoids processor 430 delays while waiting for data. These and other modules can control or be configured to control the processor 430 to perform various actions. Other system memory 404 may be available for use as well. The memory 404 can include multiple different types of memory with different performance characteristics. The processor 430 can include any general purpose processor and a hardware module or software module, such as module 1 414, module 2 416, and module 3 418 stored in storage device 412, configured to control the processor 430 as well as a special-purpose processor where software instructions are incorporated into the actual processor design. The processor 430 may essentially be a completely self-contained computing system, containing multiple cores or processors, a bus, memory controller, cache, etc. A multi-core processor may be symmetric or asymmetric.

To enable user interaction with the computing device 400, an input device 420 can represent any number of input mechanisms, such as a microphone for speech, a touch-sensitive screen for gesture or graphical input, keyboard, mouse, motion input, speech and so forth. An output device 422 can also be one or more of a number of output mechanisms known to those of skill in the art. In some instances, multimodal systems can enable a user to provide multiple types of input to communicate with the system 400. The communications interface 424 can generally govern and manage the user input and system output. There is no restriction on operating on any particular hardware arrangement and therefore the basic features here may easily be substituted for improved hardware or firmware arrangements as they are developed.

Storage device 412 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 408, read only memory (ROM) 406, and hybrids thereof.

The storage device 412 can include software modules 414, 416, 418 for controlling the processor 430. Other hardware or software modules are contemplated. The storage device 412 can be connected to the system bus 402. In one aspect, a hardware module that performs a particular function can include the software component stored in a computer-readable medium in connection with the necessary hardware components, such as the processor 430, bus 402, display 436, and so forth, to carry out the function.

The controller 410 can be a specialized microcontroller or processor on the system 400, such as a BMC (baseboard management controller). In some cases, the controller 410 can be part of an Intelligent Platform Management Interface (IPMI). Moreover, in some cases, the controller 410 can be embedded on a motherboard or main circuit board of the system 400. The controller 410 can manage the interface between system management software and platform hardware. The controller 410 can also communicate with various system devices and components (internal and/or external), such as controllers or peripheral components, as further described below.

The controller 410 can generate specific responses to notifications, alerts, and/or events and communicate with remote devices or components (e.g., electronic mail message, network message, etc.), generate an instruction or command for automatic hardware recovery procedures, etc. An administrator can also remotely communicate with the controller 410 to initiate or conduct specific hardware recovery procedures or operations, as further described below.

Different types of sensors (e.g., sensors 426) on the system 400 can report to the controller 410 on parameters such as cooling fan speeds, power status, operating system (OS) status, hardware status, and so forth. The controller 410 can also include a system event log controller and/or storage for managing and maintaining events, alerts, and notifications received by the controller 410. For example, the controller 410 or a system event log controller can receive alerts or notifications from one or more devices and components and maintain the alerts or notifications in a system even log storage component.

Flash memory 432 can be an electronic non-volatile computer storage medium or chip which can be used by the system 400 for storage and/or data transfer. The flash memory 432 can be electrically erased and/or reprogrammed. Flash memory 432 can include erasable programmable read-only memory (EPROM), electrically erasable programmable read-only memory (EEPROM), ROM, NVRAM, or complementary metal-oxide semiconductor (CMOS), for example. The flash memory 432 can store the firmware 434 executed by the system 400 when the system 400 is first powered on, along with a set of configurations specified for the firmware 434. The flash memory 432 can also store configurations used by the firmware 434.

The firmware 434 can include a Basic Input/Output System or its successors or equivalents, such as an Extensible Firmware Interface (EFI) or Unified Extensible Firmware Interface (UEFI). The firmware 434 can be loaded and executed as a sequence program each time the system 400 is started. The firmware 434 can recognize, initialize, and test hardware present in the system 400 based on the set of configurations. The firmware 434 can perform a self-test, such as a Power-on-Self-Test (POST), on the system 400. This self-test can test functionality of various hardware components such as hard disk drives, optical reading devices, cooling devices, memory modules, expansion cards and the like. The firmware 434 can address and allocate an area in the memory 404, ROM 406, RAM 408, and/or storage device 412, to store an operating system (OS). The firmware 434 can load a boot loader and/or OS, and give control of the system 400 to the OS.

The firmware 434 of the system 400 can include a firmware configuration that defines how the firmware 434 controls various hardware components in the system 400. The firmware configuration can determine the order in which the various hardware components in the system 400 are started. The firmware 434 can provide an interface, such as an UEFI, that allows a variety of different parameters to be set, which can be different from parameters in a firmware default configuration. For example, a user (e.g., an administrator) can use the firmware 434 to specify clock and bus speeds, define what peripherals are attached to the system 400, set monitoring of health (e.g., fan speeds and CPU temperature limits), and/or provide a variety of other parameters that affect overall performance and power usage of the system 400.

While firmware 434 is illustrated as being stored in the flash memory 432, one of ordinary skill in the art will readily recognize that the firmware 434 can be stored in other memory components, such as memory 404 or ROM 406, for example. However, firmware 434 is illustrated as being stored in the flash memory 432 as a non-limiting example for explanation purposes.

System 400 can include one or more sensors 426. The one or more sensors 426 can include, for example, one or more temperature sensors, thermal sensors, oxygen sensors, chemical sensors, noise sensors, heat sensors, current sensors, voltage detectors, air flow sensors, flow sensors, infrared thermometers, heat flux sensors, thermometers, pyrometers, etc. The one or more sensors 426 can communicate with the processor, cache 428, flash memory 432, communications interface 424, memory 404, ROM 406, RAM 408, controller 410, and storage device 412, via the bus 402, for example. The one or more sensors 426 can also communicate with other components in the system via one or more different means, such as inter-integrated circuit (I2C), general purpose output (GPO), and the like.

FIG. 5 illustrates an example computer system 500 having a chipset architecture that can be used in executing the described method(s) or operations, and generating and displaying a graphical user interface (GUI). Computer system 500 can include computer hardware, software, and firmware that can be used to implement the disclosed technology. System 500 can include a processor 510, representative of any number of physically and/or logically distinct resources capable of executing software, firmware, and hardware configured to perform identified computations. Processor 510 can communicate with a chipset 502 that can control input to and output from processor 510. In this example, chipset 502 outputs information to output 514, such as a display, and can read and write information to storage device 516, which can include magnetic media, and solid state media, for example. Chipset 502 can also read data from and write data to RAM 518. A bridge 504 for interfacing with a variety of user interface components 506 can be provided for interfacing with chipset 502. Such user interface components 506 can include a keyboard, a microphone, touch detection and processing circuitry, a pointing device, such as a mouse, and so on. In general, inputs to system 500 can come from any of a variety of sources, machine generated and/or human generated.

Chipset 502 can also interface with one or more communication interfaces 508 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 510 analyzing data stored in storage 516 or 518. Further, the machine can receive inputs from a user via user interface components 506 and execute appropriate functions, such as browsing functions by interpreting these inputs using processor 510.

Moreover, chipset 502 can also communicate with firmware 512, which can be executed by the computer system 500 when powering on. The firmware 502 can recognize, initialize, and test hardware present in the computer system 500 based on a set of firmware configurations. The firmware 512 can perform a self-test, such as a POST, on the system 500. The self-test can test functionality of the various hardware components 502-518. The firmware 512 can address and allocate an area in the memory 518 to store an OS. The firmware 512 can load a boot loader and/or OS, and give control of the system 500 to the OS. In some cases, the firmware 512 can communicate with the hardware components 502-510 and 514-518. Here, the firmware 512 can communicate with the hardware components 502-510 and 514-518 through the chipset 502 and/or through one or more other components. In some cases, the firmware 512 can communicate directly with the hardware components 502-510 and 514-518.

It can be appreciated that example systems 300, 400 and 500 can have more than one processor (e.g., 363, 430, 510) or be part of a group or cluster of computing devices networked together to provide greater processing capability.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described herein.

Various aspects of the present technology provide systems and methods for providing fresh air flow toward downstream components of a system. While specific examples have been cited above showing how the optional operation can be employed in different instructions, other examples can incorporate the optional operation into different instructions. For clarity of explanation, in some instances the present technology can be presented as including individual functional blocks including functional blocks comprising devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present patent application can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technologies can comprise hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response requests from user devices, such as by executing one or more Web applications that can be implemented as one or more scripts or programs written in any programming language, such as Java®, C, C# or C++ or any scripting language, such as Perl, Python or TCL, as well as combinations thereof. The server(s) can also include database servers, including without limitation those commercially available from open market.

The server system can include a variety of data stores and other memory and storage media as discussed above. These can reside in a variety of locations, such as on a storage medium local to (and/or resident in) one or more of the computers or remote from any or all of the computers across the network. In a particular set of examples, the information can reside in a storage-area network (SAN) familiar to those skilled in the art. Similarly, any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present technology.

The specification and drawings are, accordingly, to be regarded in an illustrative rather than a restrictive sense. It will, however, be evident that various modifications and changes can be made thereunto without departing from the broader spirit and scope of the patent application as set forth in the claims.

What is claimed is:

1. An apparatus, comprising:
a housing with a first end and a second end, the housing comprising a base portion and first and second opposing sidewalls extending from the first end to the second end;
a first plurality of partitions disposed in the housing, each of the first plurality of partitions extending from the first sidewall to the second sidewall and spaced apart from each other to define a plurality of partition rows; and
a second plurality of partitions disposed in the housing, each of the second plurality of partitions spaced apart from each other and arranged to intersect each of the first plurality of partitions to define a plurality of compartments in each of the plurality of partition rows,
wherein each of the first plurality of partitions includes at least one first ventilation opening associated with each of the plurality of compartments, and
wherein each one of the second plurality of partitions comprises at least one partition duct extending through the plurality of partition rows and at least one second ventilation opening connecting the at least one partition duct to associated ones of the plurality of compartments, the at least one second ventilation opening disposed on each one of the second plurality of partitions toward the second end.

2. The apparatus of claim 1, further comprising:
at least one first sidewall duct disposed in the housing along one of the first sidewall or the second sidewall, the at least one first sidewall duct connecting an portion of the housing towards the first end beyond the plurality of rows to an interior one of the plurality of rows.

3. The apparatus of claim 2, further comprising:
at least one second sidewall duct disposed in the housing along one of the first sidewall or the second sidewall, the at least one second sidewall duct connecting an portion of the housing towards the second end beyond the plurality of rows to an interior one of the plurality of rows.

4. The apparatus of claim 3, wherein each of the at least one first sidewall duct and the at least one second sidewall duct comprises at least one third ventilation opening connecting the corresponding sidewall duct to associated ones of the plurality of compartments, the at least one third ventilation opening facing the second end.

5. The apparatus of claim 4, wherein the at least one third ventilation opening is configured to be open or close.

6. The apparatus of claim 5, wherein each of the plurality of compartments includes a temperature sensor.

7. The apparatus of claim 6, further comprises a processor, and a computer-readable medium storing instructions that, when executed by the processor, cause the apparatus to perform operations comprising:
determining that a measured temperature of one of the plurality of compartments is above a threshold temperature; and
opening the at least one third ventilation opening to cool down components located in the corresponding compartment.

8. The apparatus of claim 1, wherein the at least one second ventilation opening is configured to be open or close.

9. The apparatus of claim 8, wherein each of the plurality of compartments includes a temperature sensor.

10. The apparatus of claim 9, further comprises a processor, and a computer-readable medium storing instructions that, when executed by the processor, cause the apparatus to perform operations comprising:
determining that a measured temperature of one of the plurality of compartments is above a threshold temperature; and
opening the at least one second ventilation opening to cool down components located in the corresponding compartment.

11. The apparatus of claim 1, wherein the base portion comprises a circuit board configured to support a plurality of storage devices.

12. The apparatus of claim 11, wherein the circuit board comprises at least one type of interface that includes a Serial Attached SCSI (SAS) interface, a serial ATA (SATA) interface, or a Peripheral Component Interconnect Express (PCIe) interface.

13. The apparatus of claim 12, wherein the SAS interface or the SATA interface is configured to support a HDD, and wherein the PCIe interface is configured to support a solid state drive (SSD).

14. The apparatus of claim 13, wherein the apparatus further includes a plurality of storage devices comprising at least a SAS HDD, SATA HDD, or SSD.

15. A computer-implemented method for providing fresh air to downstream components of a system that comprises a housing with a first end and a second end, a first plurality of partitions, and a second plurality of partitions, comprising:
causing the housing to include a base portion, and first and second opposing sidewalls extending from a first end of the housing to a second end of the housing;
causing the first plurality of partitions to be disposed in the housing, each of the first plurality of partitions extending from the first sidewall to the second sidewall and spaced apart from each other to define a plurality of partition rows;
causing the second plurality of partitions disposed in the housing, each of the second plurality of partitions spaced apart from each other and arranged to intersect each of the first plurality of partitions to define a plurality of compartments in each of the plurality of partition rows;
causing each of the first plurality of partitions to include at least one ventilation opening associated with each of the plurality of compartments; and
causing each of the second plurality of partitions to include at least one partition duct extending through the plurality of partition rows and at least one second ventilation opening connecting the at least one partition duct to associated ones of the plurality of compartments.

16. The computer-implemented method of claim 15, wherein the system further comprises at least one first sidewall duct disposed in the housing along one of the first sidewall or the second sidewall, the at least one first sidewall duct connecting an portion of the housing towards the first end beyond the plurality of rows to an interior one of the plurality of rows.

17. The computer-implemented method of claim 16, wherein the system further comprises at least one second sidewall duct disposed in the housing along one of the first sidewall or the second sidewall, the at least one second sidewall duct connecting an portion of the housing towards the second end beyond the plurality of rows to an interior one of the plurality of rows.

18. The computer-implemented method of claim 17, wherein each of the at least one first sidewall duct and the at least one second sidewall duct comprises at least one third ventilation opening connecting the corresponding sidewall duct to associated ones of the plurality of compartments, the at least one third ventilation opening facing the second end.

19. The computer-implemented method of claim 15, wherein the at least one second ventilation opening is configured to be open or close, and wherein each of the plurality of compartments includes a temperature sensor.

20. The computer-implemented method of claim 19, further comprising:
 determining that a measured temperature of one of the plurality of compartments is above a threshold temperature; and
 opening the at least one second ventilation opening to cool down components located in the corresponding compartment.

\* \* \* \* \*